United States Patent [19]

Adrian et al.

[11] Patent Number: 4,614,918
[45] Date of Patent: Sep. 30, 1986

[54] FREQUENCY GENERATOR WITH DIGITALLY CONTROLLED PHASE MODULATION

[75] Inventors: Donald J. Adrian, Leucadia; Lawrence E. Christensen, La Jolla; James C. Hanselman, San Diego, all of Calif.

[73] Assignee: The United States of America as represented by the Secretary of the Navy, Washington, D.C.

[21] Appl. No.: 200,728

[22] Filed: Oct. 27, 1980

[51] Int. Cl.[4] .............................................. H03K 7/04
[52] U.S. Cl. ................................ 332/16 R; 332/9 R; 375/23
[58] Field of Search ...................... 332/9 R, 9 T, 16 R; 375/22, 23; 370/10; 360/44; 307/271, 356; 328/55

[56] References Cited

U.S. PATENT DOCUMENTS

| | | | |
|---|---|---|---|
| 3,162,857 | 12/1964 | Sanders | 375/23 X |
| 3,898,589 | 8/1975 | Tustison | 375/23 X |
| 3,943,446 | 3/1976 | Quidort | 375/22 |
| 3,959,586 | 5/1976 | Blomenkamp | 332/9 T X |

Primary Examiner—Edward P. Westin
Attorney, Agent, or Firm—Robert F. Beers; Ervin F. Johnston; Harvey Fendelman

[57] ABSTRACT

A frequency generator is disclosed in which the phase modulation of a stable carrier frequency is precisely and repeatedly controlled by a digital input. A digital-to-analog converter (DAC) receives a digital input frm the output of a computer and provides an analog voltage output. An analog ramp signal generator is also provided such that the output of the analog ramp signal generator and the output of the digital-to-analog converter form the inputs to a voltage comparator network. The output of the voltage comparator network switches state each time the ramp signal generator output exceeds the digital-to-analog converter output. The output of the voltage comparator network is used to trigger a one-shot multivibrator which thereby produces a square wave that is advanced or retarded in phase in response to the value of the digital input to the digital-to-analog converter. The one-shot multivibrator output is applied to a bandpass filter which has a suitable center frequency and passband to allow only the seventh harmonic of the fundamental period passage thereby generating a digitally phase controlled sine wave output.

7 Claims, 2 Drawing Figures

FREQUENCY GENERATOR WITH DIGITALLY CONTROLLED PHASE MODULATION

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates generally to the field of phase modulation techniques and apparatus and more specifically to the field of computer control of the phase modulation of a carrier frequency.

Many prior art systems have been disclosed for accomplishing phase modulation in one manner or another. Typically phase modulation is done by phase comparison at the carrier frequency to accomplish linear modulation over a large fraction of a cycle but generally not over a total 360°. Electromechanical phase shifters have previously been used to modulate a stable carrier frequency. The rate of change of phase was fairly accurately controlled by this technique but the phase value has not been precisely resettable. Such electromechanical phase shifters are also cumbersome, unreliable and limited in phase modulation rates.

SUMMARY OF THE INVENTION

The present invention is directed to a phase modulation technique in which phase modulation over an entire 360° is possible and in which digital control of the phase modulation is provided. This digital control is preferably and most conveniently performed under computer control. By use of the technique of the present invention, precise and repeatable phase modulation of a stable carrier frequency is enabled. The present invention, moreover, is particularly suitable for those applications where the phase control is required to be continuous over any number of cycles so that a single sideband signal may be generated as well as complex forms of modulation. For instance, it offers the capability of generating a simulated doppler frequency transmission for a period of time, going off the air for a succeeding period of time or making a different doppler frequency transmission, and then returning to the first type of transmission with exactly the proper phase and rate of change of phase to represent a continuous and uninterrupted movement of a simulated moving object. This may be accomplished under control of a computer which calculates and presents an initial input word, and succeeding data, to the input of the DAC. This continuous linear phase control over an unlimited number of cycles is enabled by the present invention. Further, since a computer may be used to control the phase modulation, complex modulation may be accomplished in a convenient, expedient manner and the capability of changing the desired modulation by reprogramming the computer is enabled.

The above advantages of the present invention permitting continuous linear phase control over an unlimited number of cycles is achieved by using a ramp signal generator at a sub-harmonic of the desired frequency and operating a comparator in response to the ramp signal generator output at the central linear portion of the ramp. More specifically, a sine wave of a predetermined frequency, e.g. 1.75 MHz, is generated by extracting a harmonic, e.g. the seventh harmonic, from a square wave of a different frequency, e.g. 250 kHz, by means of a bandpass filter. The 250 kHz square wave is produced by a one-shot multivibrator. The delay time of the one-shot multivibrator is set for a predetermined period such as 2 microseconds. The one-shot multivibrator is triggered at a nominal rate, 250 kHz in the present example by a voltage comparator. Phase modulation on the 1.75 MHz sine wave is introduced by varying the trigger rate of the one-shot slightly from the 250 kHz rate. If the trigger rate is slightly higher than the 250 kHz rate the phase of the 1.75 MHz wave will advance. If the trigger rate is slightly lower than the 250 kHz rate, the phase will retard. The variable rate trigger source, i.e. the voltage comparator, compares the relative levels of each of two input voltages and its output changes state whenever one of its inputs becomes greater than the other. One input is provided by the analog ramp generator. This ramp generator produces a positive going sawtooth waveform. The second input to the comparator is provided by an n-bit digital-to-analog converter. The digital-to-analog converter output voltage is determined by the n-bit phase word. Whenever the ramp generator output becomes greater than the digital-to-analog converter output, the comparator output switches and thereby triggers the one-shot multivibrator.

OBJECTS OF THE INVENTION

Accordingly, it is the primary object of the present invention to disclose a novel apparatus for digitally controlling the phase modulation of a carrier signal.

It is a further object of the present invention to disclose an apparatus whereby the phase modulation of a carrier signal is controlled by a digital computer.

It is another object of the present invention to disclose a novel modulation technique which permits continuous linear phase control over an unlimited number of cycles.

It is a still further object of the present invention to disclose a technique and apparatus that has the capability of generating a simulated doppler frequency transmission for a period of time, going off the air for a succeeding period of time or making a different doppler frequency transmission, and then returning to the first type of transmission with exactly the proper phase and rate of change of phase to represent a continuous and uninterrupted movement of a simulated moving object.

Other objects, advantages and novel features of the invention will become apparent from the following detailed description of the invention when considered in conjunction with the accompanying drawings.

DESCRIPTION OF THE PREFERRED EMBODIMENT

Figure 1:
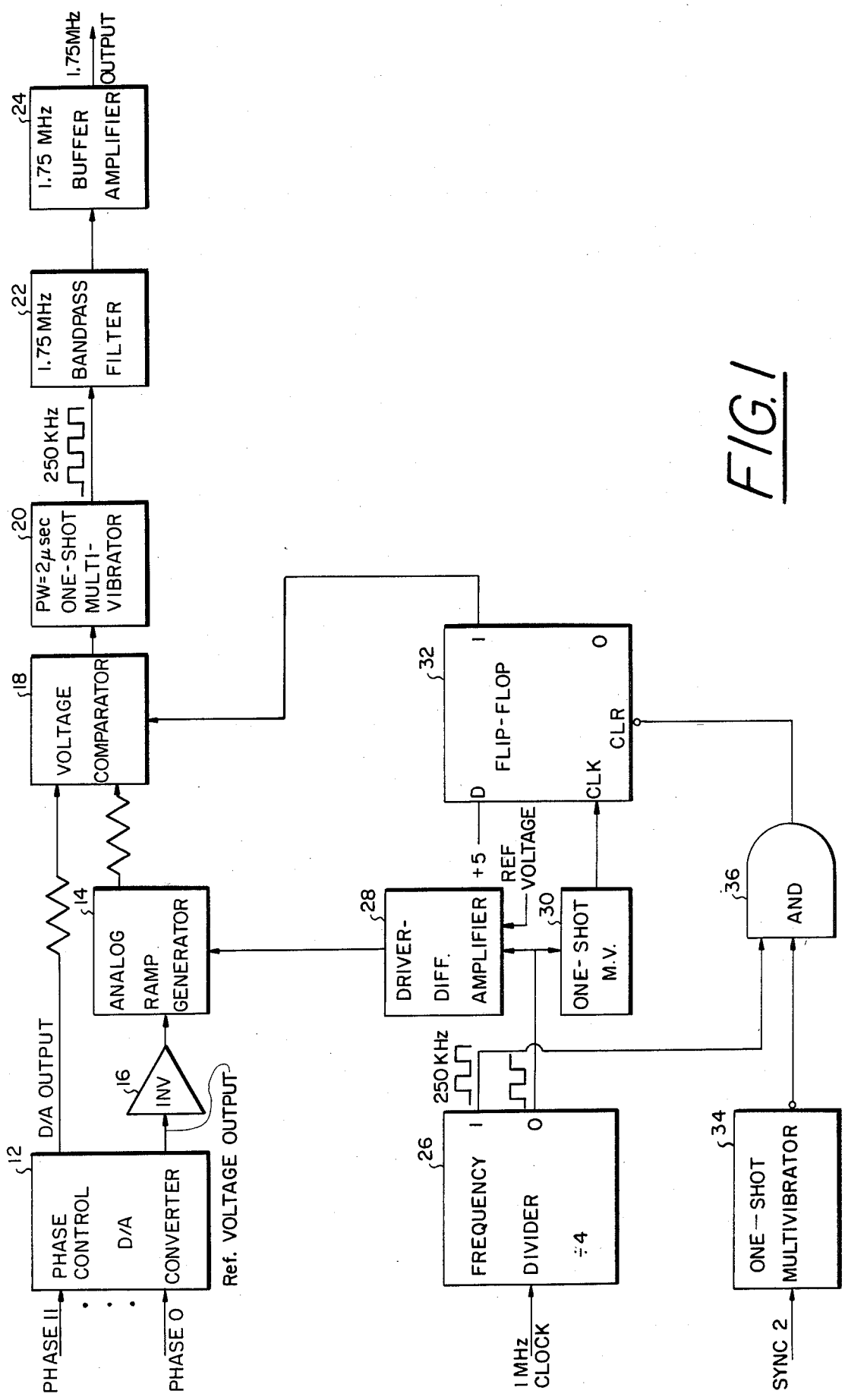
FIG. 1 is a schematic block diagram of the digitally controlled phase modulator of the present invention.

Referring now to the block diagram of the digitally controlled phase modulation signal generator of the present invention illustrated in FIG. 1, the various components and operation of the present invention will be described. It is to be understood at this point that notwithstanding the fact that specific frequencies, time delays, and other specific values are mentioned, it is within the scope of the present invention that other frequencies, delay times, odd harmonics and values may be used.

A phase control digital-to-analog converter 12 receives a digital input word which in the present embodiment is a 12-bit phase word. Preferably this 12-bit phase word is provided from a computer source and its value is determined by the computer. Analog ramp signal generator 14 has its reference voltage input provided via inverter 16 and the reference voltage output of the digital-to-analog converter 12. Alternately, of course, the analog ramp signal generator 14 could obtain its reference voltage input from a source other than the digital-to-analog converter 12. The outputs of the digital-to-analog converter 12 and the ramp signal generator 14 are furnished via resistors to the voltage comparator 18. Voltage comparator 18 provides the trigger signal for the one-shot multivibrator 20. The output of the one-shot multivibrator 20 is a repetitive waveform such as a square wave that is filtered by bandpass filter 22 which extracts the seventh or other odd order harmonic from the square wave output of the one-shot multivibrator 20. In the present example the output of one-shot multivibrator is a 250 kHz square wave and the output of bandpass filter is a 1.75 MHz sinusoid. This 1.75 MHz sinusoidal output of bandpass filter 22 is fed through buffer amplifier 24 which provides the 1.75 MHz output of the phase modulated frequency generator of the present invention. The system clock in the present embodiment is a 1 MHz clock that is furnished to frequency divider 26. Frequency divider 26 is a divide-by-four frequency divider having complementary output terminals I and O. The 250 kHz square wave output of frequency divider 26 output terminal O is furnished to driver-differential amplifier 28 which has its output connected to the gating input of the analog ramp signal generator 14.

The present invention also comprises two disable networks for disabling the voltage comparator 18 upon the occurrence of predetermined conditions. In this regard one-shot multivibrator 30 receives a clock input from the frequency divider 26 and provides an output pulse of predetermined duration, 0.3 microseconds, in the present example. The output of one-shot multivibrator 30 is furnished to the clock input of flip-flop 32. As will be explained further below this network comprising one-shot multivibrator 30 and flip-flop 32 disables the output of the voltage comparator 18 for a predetermined period at the beginning of each ramp output of analog ramp signal generator 14 to avoid the effects of switching transients during this period.

A second disable network is comprised of one-shot multivibrator 34 which receives its input preferably from a computer. The input to one-shot multivibrator 34 is illustrated as SYNC 2. In the present embodiment SYNC 2 goes high when there is a change of phase input to phase control digital-to-analog converter 12 of more than a predetermined amount. The output of one-shot multivibrator 34 is connected as one of the inputs to AND gate 36 which has its output connected to the clear input of flip-flop 32. As will be explained further below the disable network comprising one-shot multivibrator 34, AND gate 36 and flip-flop 32 disables the output of voltage comparator 18 when a change of phase greater than a predetermined amount is indicated at the input to phase control digital-to-analog 12.

Figure 2:
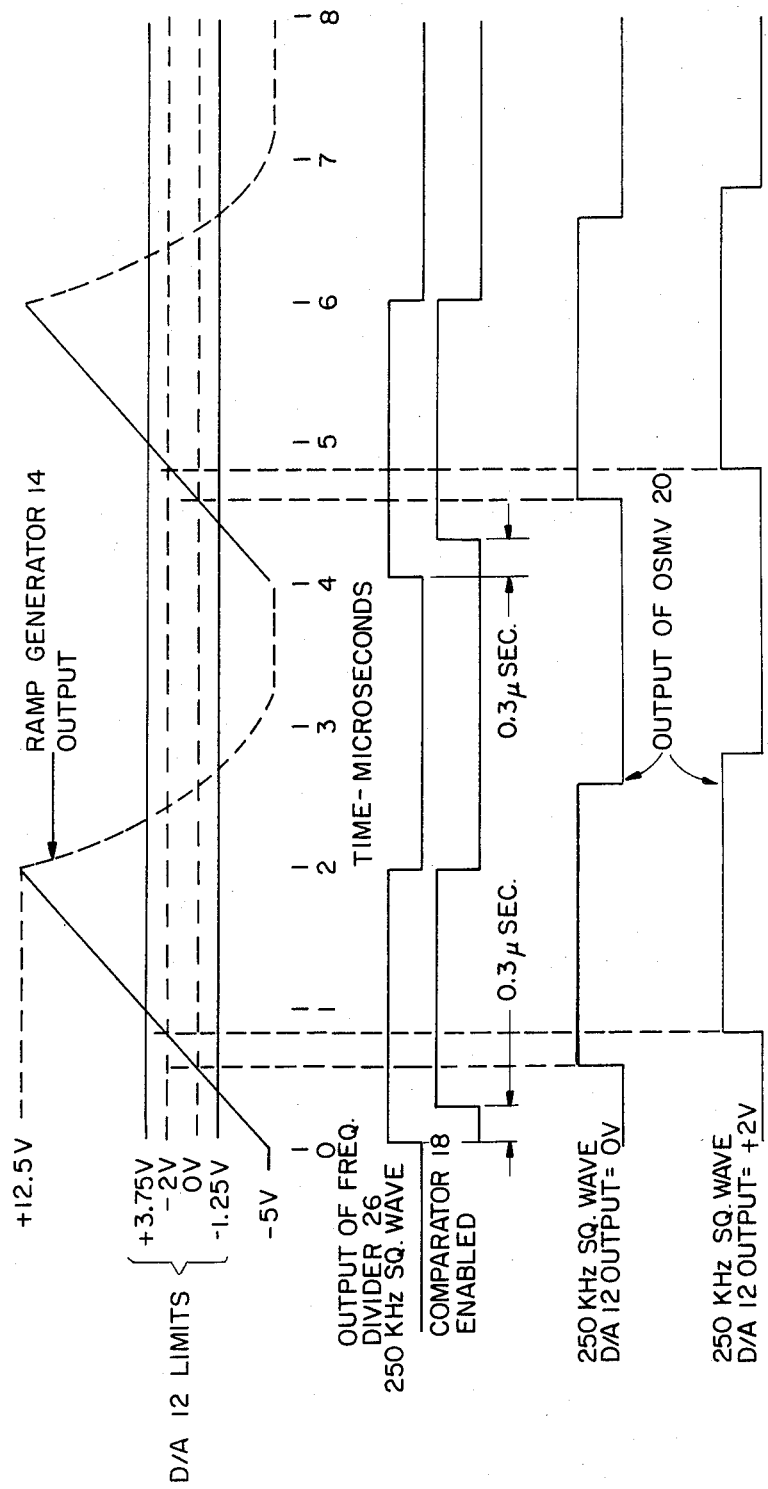
FIG. 2 is a waveform illustration of various signals generated by the components of the present invention.

The operation of the digitally controlled phase modulation signal generator in the present invention is as follows. In the present example a 1 MHz clock reference signal is presented to the input of a frequency divider 26 which divides by four to produce two outputs 180° out of phase at a frequency of 250 kHz. Phase O is directed to the ramp signal generator 14 via the driver differential amplifier 28. The output of driver 28 drives the ramp signal generator 14. The resulting sawtooth output of analog ramp generator 14 which is shown at the top of FIG. 2 is then compared with the amplified and level shifted output of the digital-to-analog converter 12. The digital-to-analog converter 12 receives an n-bit digital input word, 12 bits in the present illustration, from a computer output. The computer input to the digital-to-analog converter 12 is updated on a periodic basis, for example, every 142 microseconds. The digital-to-analog converter 12 output remains constant between these updates. When the output of analog ramp signal generator 14 rises to a value greater than the output of the digital-to-analog converter 12, the output of voltage comparator 18 will switch from high to low and trigger the one-shot multivibrator 20 which generates a series of pulses, e.g. of 2 microseconds duration. This action is illustrated in FIG. 2 for two different levels of the digital-to-analog converter 12 output voltage, i.e. 0 volts and +2 volts. The time delay which exists between the two 250 kHz square waves shown in FIG. 2 will translate to a phase shift at the output of the buffer amplifier 24. As long as the digital-to-analog converter 12 output remains at the same level, a pulse train will be generated by the one-shot multivibrator 20 with a fixed delay relative to the 250 kHz switch control signal from the driver differential amplifier 28. The 250 kHz pulse train output of the one-shot multivibrator 20 is filtered by the bandpass filter 22 which extracts the seventh harmonic of the 250 kHz signal. In the present example, the 1.75 MHz sine wave output of bandpass filter 22 is amplified to the proper level by buffer amplifier 24. Preferably, this 1.75 MHz sinusoidal output is sent to a transmitter. Since varying the output level of the digital-to-analog converter 12 changes the time at which the ramp signal generator 14 output exceeds the output of the converter 12, varying the output of the digital-to-analog converter 12 translates to a change in phase of the output of buffer amplifier 24.

In order to prevent triggering the comparator 18 on transients which are produced during the beginning of each ramp from ramp signal generator 14, provision is made to disable the comparator 18 during the time that the "1" output of flip-flop 32 is low via the action of AND gate 36 and flip-flop 32. One-shot multivibrator 30 which enables the comparator 18 by setting the "1" output of flip-flop 22 receives a reference input from one of the complementary outputs of frequency divider 26. The output pulse train of one-shot multivibrator 30 is fed into the clock input of the flip-flop 32. The output 1 of the flip-flop 32 will be low at this time, i.e. at the end of the 0.3 microsecond period. At the end of this 0.3 microsecond period there will be a positive going pulse from the one-shot multivibrator 30 which is sent to the clock input of flip-flop 32. This positive going edge then enables the "1" output of flip-flop 32. The strobe input to voltage comparator 18 is thus disabled, i.e. low, for a period of 0.3 microseconds after which it is permitted to go high. This action is further illustrated in the waveforms of FIG. 2.

The comparator 18 is also disabled when the digital-to-analog converter 12 output makes a major excursion, for example either from +3.75 volts to −1.25 volts or from −1.25 volts to +3.75 volts. The input on SYNC 2 is sent by a computer whenever a major transition occurs. When the SYNC 2 input goes high one-shot multivibrator 34 is triggered such that its output goes low and stays low for 2.6 microseconds, in the present example. This output of one-shot multivibrator 30 is received by one of the inputs of AND gate 36 which receives as its other input one of the complementary outputs of the frequency divider 26. Upon receipt of this low input from one-shot 34, the output of AND gate 36 goes low. This low output of AND gate 36 which is connected to the clear input of flip-flop 32 causes the "1" output of flip-flop 32 to go low, for 2.6 microseconds in the present example. The "1" output of flip-flop 32 which is the strobe input of the voltage comparator 18, in going low, forces the comparator output to go low or, in other words disables or inhibits it.

Obviously many modifications and variations of the present invention are possible in the light of the above teachings. It is therefore to be understood that within the scope of the appended claims the invention may be practiced otherwise than as specifically described.

What is claimed is:

1. A frequency generator comprising:
   first means for generating a repetitive wave having a predetermined rate of repetition;
   second means having an input and an output, said output being connected to said first means for triggering said first means at a variable rate in response to a signal at its input;
   third means having its output connected to the input of said second means for receiving a digital input signal and for generating an analog output signal in response thereto; and
   means for disabling the output of said second means during a predetermined period of time when the amplitude of said analog output signal varies by more than a predetermined amount.

2. The frequency generator of claim 1 wherein said disabling means further comprises:
   a first disable one-shot multivibrator having an output; and
   a flip-flop network connected to the output of said first disable one-shot multivibrator and being connected to said second means.

3. The frequency generator of claim 2 wherein said disabling means further comprises:
   a second disable one-shot multivibrator having an output; and
   an AND gate having an input connected to the output of said second disable one-shot multivibrator and being connected to said flip-flop network.

4. A frequency generator comprising:
   a digital-to-analog converter having an input and
   a ramp signal generator having an output;
   a comparator having a first input connected to the output of said digital-to-analog converter and a second input connected to the output of said ramp signal generator for generating a variable rate trigger signal;
   means for receiving said variable rate trigger signal and for generating a repetitive wave in response thereto, said means for receiving comprising a one-shot multivibrator;
   a bandpass filter connected to the output of said means for receiving; and
   means for disabling the output of said comparator during a predetermined period of time, said disabling means being for disabling the output of said comparator when the voltage on said digital-to-analog converter output varies by more than a predetermined amount.

5. The frequency generator of claim 4 wherein said disabling means comprises:
   a first disable one-shot multivibrator having an input and an output;
   a flip-flop network connected to said first disable one-shot multivibrator and to said comparator.

6. The frequency generator of claim 5 wherein said disabling means further comprises:
   a second disable one-shot multivibrator having an output; and
   an AND gate having an input connected to said output of said second disable one-shot multivibrator and having an output connected to said flip-flop network.

7. The frequency generator of claims 3 or 6 further comprising a clock frequency generator having an output connected to said first disable one-shot multivibrator and having another output connected to said AND gate.

* * * * *